United States Patent
US 6,833,318 B2
Weng et al.
Dec. 21, 2004

(54) GAP-FILLING PROCESS

(75) Inventors: Chun-Jen Weng, Tainan (TW); Juan-Yi Chen, Chiai (TW); Hong-Tsz Pan, Hsinchu (TW); Cedric Lee, Hsinchu (TW); Der-Yuan Wu, Hsinchu (TW); Jackson Lin, Taitung (TW); Yeong-Song Yen, Taipei (TW); Lawrence Lin, Taipei (TW); Ying-Chung Tseng, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/065,803

(22) Filed: Nov. 20, 2002

(65) Prior Publication Data

US 2004/0097069 A1 May 20, 2004

(51) Int. Cl.⁷ .......................................... H01L 21/4763
(52) U.S. Cl. ...................... 438/631; 438/633; 438/634; 438/638
(58) Field of Search ............................... 438/631, 633, 438/634, 638, FOR 355, FOR 489

(56) References Cited

U.S. PATENT DOCUMENTS 6,100,184 A * 8/2000 Zhao et al. ................. 438/638
6,184,138 B1 * 2/2001 Ho et al. ..................... 438/687
6,274,499 B1 * 8/2001 Gupta et al. ................. 438/692
6,294,460 B1 * 9/2001 Subramanian et al. ...... 438/636
6,316,351 B1 * 11/2001 Chen et al. .................. 438/638
6,352,921 B1 * 3/2002 Han et al. ................... 438/638
6,541,367 B1 * 4/2003 Mandal ....................... 438/622

OTHER PUBLICATIONS

Ogure et al., U.S. patent application Publication U.S. 2002/0111022 A1, Pub. Date: Aug. 15, 2002.*
Lu et al., U.S. patent application Publication U.S. 2002/0137337 A1, Pub. Date: Sep. 26, 2002.*
Jiang et al., U.S. patent application Publication U.S. 2002/0139771 A1, Pub. Date: Oct. 3, 2002.*

* cited by examiner

Primary Examiner—George Fourson
Assistant Examiner—Michelle Estrada
(74) Attorney, Agent, or Firm—J.C. Patents

(57) ABSTRACT

A gap-filling process is provided. A substrate having a dielectric layer thereon is provided. The dielectric layer has an opening therein. A gap-filling material layer is formed over the dielectric layer and inside the opening. A portion of the gap-filling material is removed from the gap-filling material layer to expose the dielectric layer. A gap-filling material treatment of the surface of the gap-filling material layer and the dielectric layer is carried out to planarize the gap-filling material layer so that a subsequently formed bottom anti-reflection coating or material layer over the gap-filling material layer can have a high degree of planarity.

13 Claims, 6 Drawing Sheets

GAP-FILLING PROCESS

BACKGROUND OF INVENTION

1. Field of Invention

The present invention relates to a process for forming semiconductor devices. More particularly, the present invention relates to a gap-filling process for forming semiconductor devices.

2. Description of Related Art

Gap-filling process is a technique that has many applications in semiconductor production. In semiconductor manufacturing, the gap-filling process is often used after openings are formed. Different material is deposited into the openings according to the type of structure desired. For example, insulating material is deposited into the trenches of a shallow trench isolation (STI) structure and conductive material is deposited into the contact window of an inter-metal dielectric (ILD) structure, the via of an inter-metal dielectric (IMD) structure or the metallic interconnect opening of a dual damascene structure.

FIGS. 1A to 1D are schematic cross-sectional views showing the progression of steps for forming a gap-filled material layer in the via opening of a via first dual damascene (VFDD) structure using a conventional gap-filling method. As shown in FIG. 1A, a substrate 100 having a conductive line 102 thereon is provided. A protective layer 104, a dielectric layer 106, an etching stop layer 108, a second dielectric layer 110, a cap layer 112 are sequentially formed over the substrate. A via opening 114 that passes through the cap layer 112, the second dielectric layer 110, the etching stop layer 108, the dielectric layer 106 and exposes the protective layer 104 is formed.

As shown in FIG. 1B, a gap-filling material is deposited into the via opening 114 to form a gap-filling material layer 116.

As shown in FIG. 1C, a polishing or etching process is conducted to remove excess gap-filling material from the gap-filling material layer 116 and expose the cap layer 112. Hence, a gap-filled material layer 118 is formed inside the via opening 114.

As shown in FIG. 1D, a bottom anti-reflection coating (BARC) 120 is formed over the cap layer 112 and the gap-filled material layer 118.

However, the aforementioned method of forming a gap-filling material layer 118 inside the via opening 114 has a few problems. When the gap-filling material layer 116 is formed over the substrate 100, a downward caving surface is formed near the mouth of the via opening 114 leading to the formation of a recess cavity in the gap-filling material layer 118 even after polishing or etching. The presence of this recess cavity in the gap-filling material layer 118 results in the production of a similar cavity in the subsequently formed bottom anti-reflection coating 120 and photoresist layer above the gap-filling material layer 118. A non-planar profile is a major factor that intensifies the so-called striation effect. The striation effect contributes to a worsening of thickness uniformity in an overlying photoresist layer. Ultimately, critical dimensions (CD) and the dimensions measured in the after etching inspection (AEI) may deviate too much from the desired range because an accurate pattern is no longer reproduced.

In addition, the gap-filling material layer 118 may also be subjected to the damaging effects caused by the overlying bottom anti-reflection coating 120 or photoresist layer. In other words, the material in the bottom anti-reflection coating 120 or the photoresist layer and the material in the gap-filling material layer 118 may intermix leading to a loss of gap material. As a result, there is a further intensification of the striation effect and/or a distortion of the pattern profile after etching the inter-metal dielectric layer rendering the formation of an accurate pattern difficult.

SUMMARY OF INVENTION

Accordingly, one object of the present invention is to provide a gap-filling process capable of producing a gap-filling material layer with an improved surface planarity so that a subsequently formed bottom anti-reflection coating or photoresist layer over the gap-filling material layer also has a better surface planarity.

A second object of this invention is to provide a gap-filling process capable of preventing the loss of gap-filling material from a gap-filling material layer due to contact with a bottom anti-reflection coating or a photoresist layer. Consequently, the gap-filling material layer and the bottom anti-reflection coating or the photoresist layer can have a better surface planarity.

To achieve these and other advantages and in accordance with the purpose of the invention, as embodied and broadly described herein, the invention provides a gap-filling process. A substrate having a dielectric layer thereon is provided. An opening is formed in the dielectric layer. A gap-filling material layer is formed over the dielectric layer and inside the opening. A portion of the gap-filling material layer is removed to expose the dielectric layer. The gap-filling material layer and the surface of the dielectric layer undergo a gap-filling material treatment.

The gap-filling material treatment may include etching the dielectric layer and the gap-filling material layer to planarize the gap-filling material layer.

In addition, the gap-filling material treatment may also include performing a plasma processing, an ultraviolet curing or a chemical immersion of the gap-filling material layer to form a protective layer over the gap-filling material layer.

Furthermore, the gap-filling material treatment may involve etching the dielectric layer and the gap-filling material layer to planarize the gap-filling material layer and then performing a plasma processing, an ultraviolet curing or a chemical immersion of the gap-filling material layer to form a protective layer over the gap-filling material layer.

In this invention, the gap-filling material layer is etched to form a planar surface. Hence, any layer deposited over the gap-filling material layer can have a high level of planarity that facilitates the formation of a correct pattern in subsequent photolithographic and etching operation.

Since a protective layer is formed over the gap-filling material layer, intermixing of material between the bottom anti-reflection coating or the photoresist layer with the gap-filling material layer is stopped. Thus, the gap-filling material layer and the bottom anti-reflection coating or the photoresist layer can have a high degree of surface planarity. Ultimately, an accurate pattern is reproduced after a photolithographic and etching operation.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
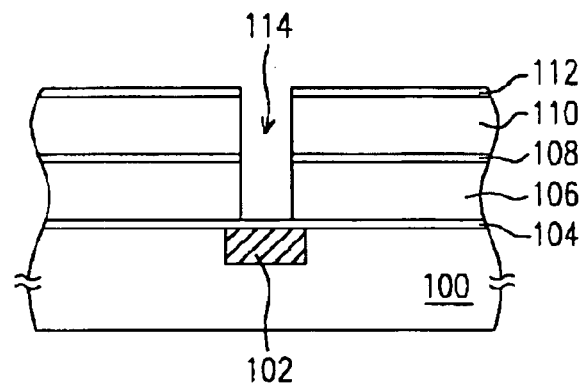
FIGS. 1A to 1D are schematic cross-sectional views showing the progression of steps for forming a gap-filled material layer in the via opening of a via first dual damascene (VFDD) structure using a conventional gap-filling method.
Figure 1B:
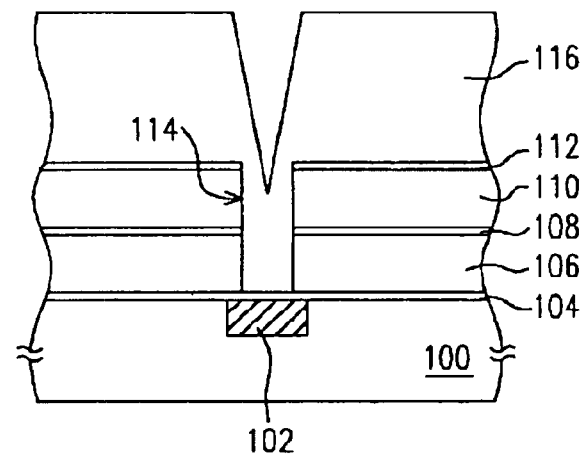
Figure 1C:
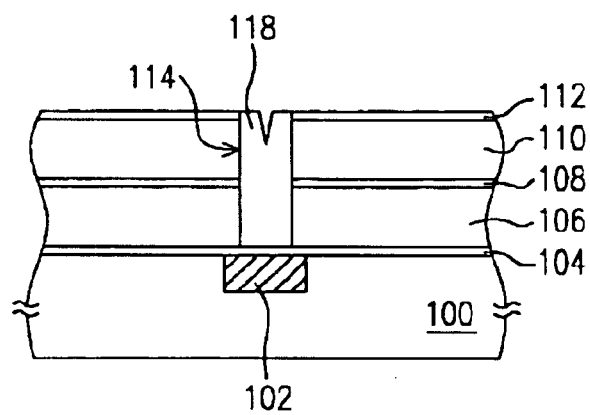
Figure 1D:
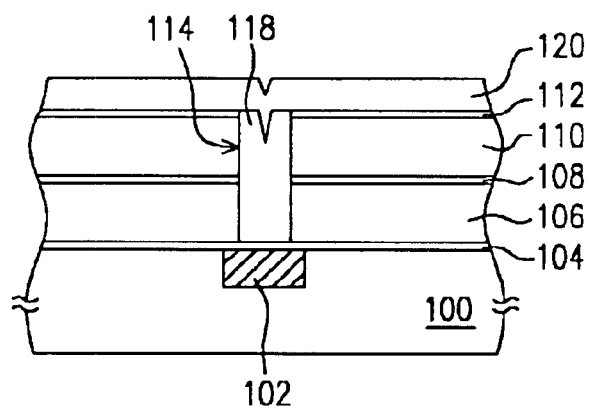

Reference will now be made in detail to the present preferred embodiments of the invention, examples of which are illustrated in the accompanying drawings. Wherever possible, the same reference numbers are used in the drawings and the description to refer to the same or like parts.

Figure 2A:
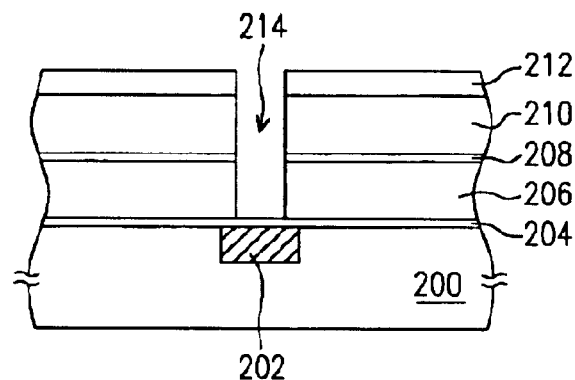
FIGS. 2A to 2E are schematic cross-sectional views showing the progression of steps for forming a gap-filled material layer in the via opening of a via first dual damascene (VFDD) structure using a gap-filling method according to one preferred embodiment of this invention.

FIGS. 2A to 2E are schematic cross-sectional views showing the progression of steps for forming a gap-filled material layer in the via opening of a via first dual damascene (VFDD) structure using a gap-filling method according to one preferred embodiment of this invention. As shown in FIG. 2A, a substrate 200 (devices within the substrate 200 are not drawn) having a conductive line 202 thereon is provided. A protective layer 204, a dielectric layer 206, an etching stop layer 208, a second dielectric layer 210, a cap layer 212 are sequentially formed over the substrate 200. A via opening that passes through the dielectric layer 206, the etching stop layer 208, the second dielectric layer 210, the cap layer 212 and exposes the protective layer 204 is formed.

The protective layer 204, the etching stop layer 208 and the cap layer 212 are silicon nitride layers formed, for example, by chemical vapor deposition. The dielectric layer 206 and the second dielectric layer 210 are made from a low dielectric constant material such as fluorinated silicate glass (FSG), undoped silicate glass (USG), poly-(arylene ether) (SiLK), fluorinated poly-(arylene ether) (FLARE) and hydrogen silsesquioxane (HSQ). The dielectric layers 206, 210 are formed, for example, by spin coating or chemical vapor deposition.

Figure 2B:
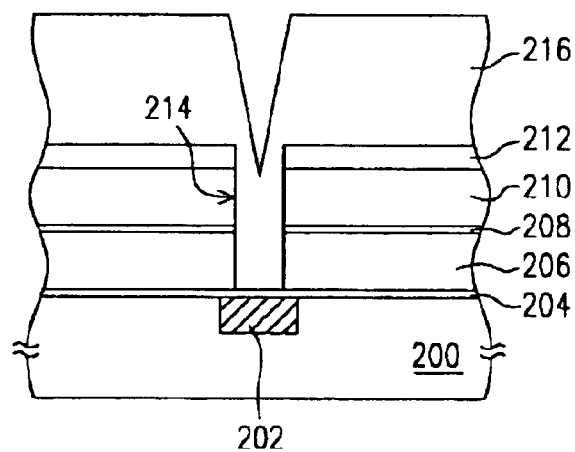

As shown in FIG. 2B, a gap-filling material layer 216 is formed over the substrate 200, filling the via opening 214. The gap-filling material layer 216 is made from a material including, for example, I-line photoresist, deep ultra-violet (DUV) photoresist or a bottom anti-reflection coating (BARC). The gap-filling material layer 216 is formed, for example, by spin coating. Note that the upper surface of the gap-filling material layer 216 close to the mouth of the via opening 214 has a downward caving depression.

Figure 2C:
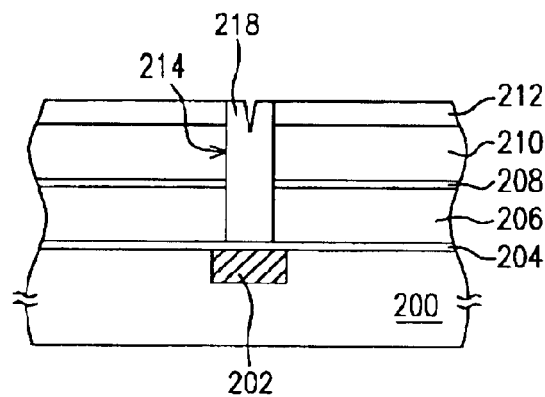

As shown in FIG. 2C, excess gap-filling material is removed from the gap-filling material layer 216 so that a gap-filling material layer 218 is formed inside the via opening 214. Excess gap-filling material is removed by chemical-mechanical polishing or etching such that the upper surface of the cap layer 212 is exposed. Even after a chemical-mechanical polishing or etching operation, the downward caving depression still persists on the upper surface of the gap-filling material layer 218.

Figure 2D:
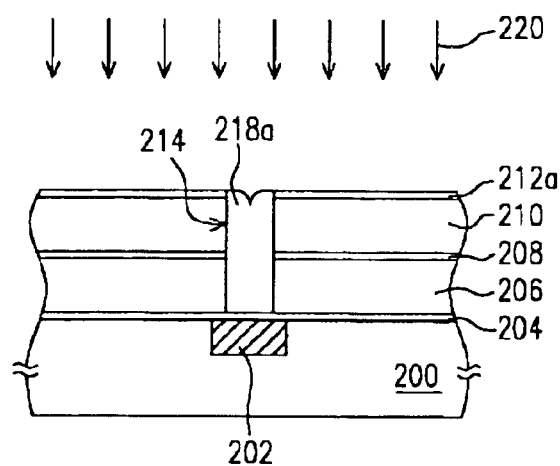

As shown in FIG. 2D, a gap-filling material treatment 220 of the cap layer 212 and the gap-filling material layer 218 is carried out so that the upper surface of the gap-filling material layer 218 is planarized. The gap-filling material treatment 220 is, for example, an etching operation that removes a portion of the cap layer 212 and the gap-filling material layer 218 on each side of the depression cavity to form a cap layer 212a and a gap-filling material layer 218a with a planar upper surface.

Figure 2E:
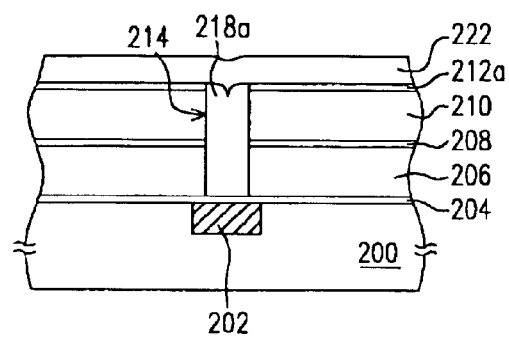

As shown in FIG. 2E, a bottom anti-reflection coating 222 is formed over the gap-filling material layer 218a and the cap layer 212a. The bottom anti-reflection coating 222 is an organic bottom anti-reflection coating such as a polyimide layer formed, for example, by spin coating. Since subsequent steps for forming a dual damascene structure are identical to the conventional method, detailed descriptions are omitted.

In the aforementioned embodiment, in order to maintain a uniform property in the cap layer 212 after the gap-filling material treatment 220 (etching operation), a thicker cap layer 212 may be produced initially. In this way, a planarized gap-filling material layer 218a with fully functional cap layer 212a is obtained after the gap-filling material treatment 220.

Figure 3A:
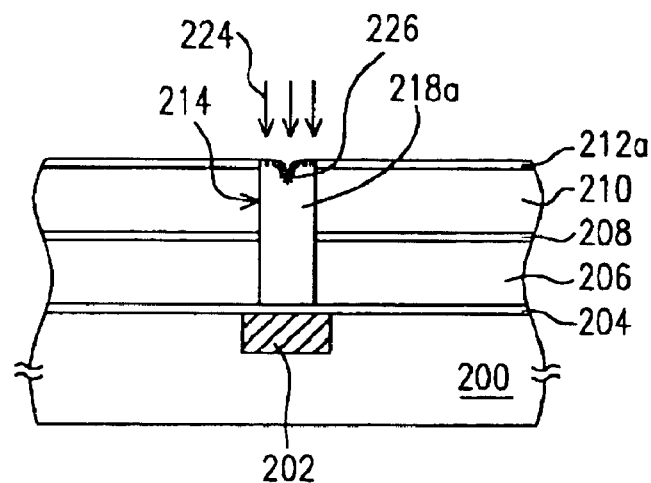
FIGS. 3A and 3B are schematic cross-sectional views showing the progression of steps for forming a gap-filled material layer in the via opening of a via first dual damascene (VFDD) structure using a conventional gap-filling method according to another preferred embodiment of this invention.
Figure 3B:
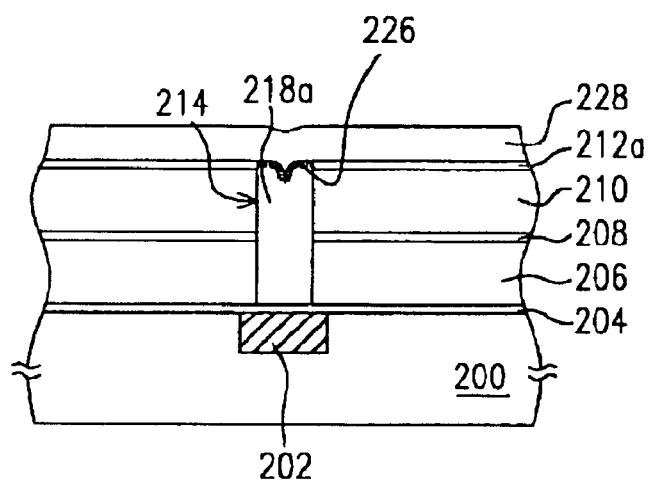

FIGS. 3A and 3B are schematic cross-sectional views showing the progression of steps for forming a gap-filled material layer in the via opening of a via first dual damascene (VFDD) structure using a conventional gap-filling method according to another preferred embodiment of this invention. FIG. 3A is a continuation from the one shown in FIG. 2D in the first embodiment. Hence, components in FIGS. 3A and 3B identical to the ones in FIGS. 2A to 2D are labeled identically.

As shown in FIG. 3A, a second gap-filling material treatment 224 is carried out after the first gap-filling material treatment 220 of the cap layer 212 and the gap-filling material layer 218 so that a protection layer 226 is formed on the surface of the gap-filling material layer 218a. The protection layer 226 protects the gap-filling material layer 218a against any damaging effects resulting from a subsequently deposited bottom anti-reflection coating or photoresist layer. The gap-filling material treatment 224 is, for example, a plasma treatment, an ultra-violet curing or a chemical immersion.

As shown in FIG. 3B, a bottom anti-reflection coating 228 is formed over the gap-filling material layer 218a and the cap layer 212a. The bottom anti-reflection coating 228 is an organic bottom anti-reflection coating such as a polyimide layer formed, for example, by spin coating. Similarly, subsequent steps for forming a dual damascene structure are identical to the conventional method. Hence, detailed descriptions are omitted.

If the etching or polishing of the gap-filling material layer 216 in FIG. 2C is able to produce a gap-filling material layer 218 with a plane upper surface, the gap-filling material treatment 220 in FIG. 2D may be skipped. In other words, the gap-filling material treatment 224 may be conducted immediately to form a protective layer over the gap-filling material layer 218a after the step in FIG. 2C.

In the aforementioned embodiments, the gap-filling process is applied to the fabrication of a dual damascene structure. However, the gap-filling process may also be applied to fill other types of opening with gap-filling material. For example, the process can be applied to form vias, contacts, conductive lines or shallow trench isolation structures.

In summary, this invention sets up a gap-filling material treatment to etch back the gap-filling material layer so that the gap-filling material layer and the cap layer (also the dielectric layer) on each side of the depressed cavity in the upper surface is removed. Since the gap-filling material layer has a plane upper surface, any subsequently formed bottom anti-reflection coating or material layer can have a similar high degree of planarity. Ultimately, a correct pattern is reproduced after photolithographic and etching processes.

In addition, a gap-filling material treatment of the upper surface of the gap-filling material layer is also carried out to form a protective layer thereon. In the presence of the protective layer, loss of gap-filling material due to the subsequent formation of a bottom anti-reflection coating or photoresist layer is prevented. Since the gap-filling material layer and the subsequently formed bottom anti-reflection coating or material layer have a high degree of planarity, a correct pattern is reproduced after photolithographic and etching processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A gap-filling process, comprising the steps of:
   providing a substrate having a dielectric layer thereon, wherein the dielectric layer has an opening therein;
   forming a gap-filling material layer over the dielectric layer and inside the opening, wherein material constituting the gap-filling material layer is a photoresist material or a bottom anti-reflection coating material;
   removing a portion of the gap-filling material from the gap-filling material layer to expose the dielectric layer; and
   conducting a gap-filling material treatment for forming a protective layer on an exposed surface of the gap-filling material layer, wherein the protective layer is not formed over the entire substrate but formed on the exposed surface of the gap-fitting material layer;
   wherein the gap-filling material treatment includes conducting an ultra-violet curing or a chemical immersion.

2. The gap-filling process of claim 1, wherein steps for treating the gap-filling material include:
   etching the dielectric layer and the gap-filling material layer; and
   forming the protective layer on the exposed surface of the gap-filling material layer by conducting an ultra-violet curing or a chemical immersion.

3. The gap-filling process of claim 1, wherein the step of removing a portion of the gap-filling material from the gap-filling material layer includes etching or chemical-mechanical polishing.

4. The gap-filling process of claim 1, wherein the photoresist material comprises I-line photoresist or deep ultra-violet photoresist.

5. The gap-filling process of claim 1, wherein the step of forming the gap-filling material layer includes spin coating.

6. The gap-filling process of claim 1, wherein after the step of treating the gap-filling material on the gap-filling material layer and the dielectric layer, further includes forming a bottom anti-reflection coating over the gap-filling material layer and the dielectric layer.

7. The gap-filling process of claim 1, wherein the opening is selected from a group consisting of a via opening, a contact opening, a trench and a dual damascene opening.

8. A gap-filling process for fabricating a dual damascene structure, comprising the steps of:
   providing a substrate;
   sequentially forming a protective layer, a first dielectric layer, an etching stop layer, a second dielectric layer and a cap layer over the substrate;
   forming a via opening passing through the first dielectric layer, the etching stop layer, the second dielectric layer and the cap layer;
   forming a gap-filling material layer over the cap layer and inside the via opening, wherein material constituting the gap-filling material layer is a photoresist material or a bottom anti-reflection coating material;
   removing a portion of the gap-filling material from the gap-filling material layer to expose the cap layer; and
   conducting a gap-filling material treatment for forming a protective layer on an exposed surface of the gap-filling material layer, wherein the protective layer is not formed over the entire substrate but formed on the exposed surface of the gap-filling material layer;
   wherein the gap-filling material treatment includes conducting an ultra-violet curing or a chemical immersion.

9. The gap-filling process of claim 8, wherein steps for treating the gap-filling material includes:
   etching the cap layer and the gap-filling material layer; and
   forming the protective layer on the exposed surface of the gap-filling material layer by conducting an ultra-violet curing or a chemical immersion.

10. The gap-filling process of claim 8, wherein the step of removing a portion of the gap-filling material from the gap-filling material layer includes etching or chemical-mechanical polishing.

11. The gap-filling process of claim 8, wherein the step of forming the gap-filling material layer includes spin coating.

12. The gap-filling process of claim 8, wherein the photoresist material comprises I-line photoresist, or deep ultra-violet photoresist.

13. The gap-filling process of claim 8, wherein after the step of treating the gap-filling material on the gap-filling material layer and the cap layer, further includes forming a bottom anti-reflection coating over the gap-filling material layer and the dielectric layer.

* * * * *